(12) United States Patent
Morin et al.

(10) Patent No.: US 10,204,982 B2
(45) Date of Patent: Feb. 12, 2019

(54) SEMICONDUCTOR DEVICE WITH RELAXATION REDUCTION LINER AND ASSOCIATED METHODS

(71) Applicant: STMicroelectronics, Inc., Coppell, TX (US)

(72) Inventors: Pierre Morin, Albany, NY (US); Qing Liu, Guilderland, NY (US); Nicolas Loubet, Guilderland, NY (US)

(73) Assignee: STMicroelectronics, Inc., Coppell, TX (US)

( * ) Notice: Subject to any disclaimer, the term of this patent is extended or adjusted under 35 U.S.C. 154(b) by 63 days.

(21) Appl. No.: 14/048,232

(22) Filed: Oct. 8, 2013

(65) Prior Publication Data

US 2015/0097212 A1    Apr. 9, 2015

(51) Int. Cl.
| | |
|---|---|
| *H01L 29/06* | (2006.01) |
| *H01L 21/84* | (2006.01) |
| *H01L 27/12* | (2006.01) |
| *H01L 29/78* | (2006.01) |
| H01L 21/8238 | (2006.01) |

(52) U.S. Cl.
CPC .......... *H01L 29/0653* (2013.01); *H01L 21/84* (2013.01); *H01L 21/845* (2013.01); *H01L 27/1203* (2013.01); *H01L 27/1211* (2013.01); *H01L 29/7842* (2013.01); *H01L 21/823807* (2013.01)

(58) Field of Classification Search
CPC ......... H01L 27/76264; H01L 27/76283; H01L 29/7846; H01L 29/7842; H01L 29/78; H01L 29/66; H01L 29/417; H01L 29/06; H01L 29/772; H01L 29/1054
See application file for complete search history.

(56) References Cited

U.S. PATENT DOCUMENTS

| | | | |
|---|---|---|---|
| 7,279,769 B2 | 10/2007 | Ishitsuka et al. | |
| 2005/0026390 A1* | 2/2005 | Chi | H01L 21/76224 438/437 |
| 2005/0253199 A1* | 11/2005 | Nagaoka | H01L 21/76227 257/374 |
| 2006/0014366 A1* | 1/2006 | Currie | 438/517 |
| 2006/0087000 A1* | 4/2006 | Okuno | 257/506 |
| 2006/0131665 A1* | 6/2006 | Murthy | H01L 29/665 257/384 |
| 2008/0029815 A1* | 2/2008 | Chen et al. | 257/347 |
| 2009/0283852 A1* | 11/2009 | Gutmann | H01L 21/76232 257/510 |
| 2011/0210427 A1* | 9/2011 | Hoentschel | H01L 21/3081 257/622 |
| 2012/0104498 A1* | 5/2012 | Majumdar | H01L 29/66545 257/351 |
| 2014/0054699 A1* | 2/2014 | Liu et al. | 257/347 |

\* cited by examiner

*Primary Examiner* — Phuc Dang
(74) *Attorney, Agent, or Firm* — Seed Intellectual Property Law Group LLP

(57) ABSTRACT

A method for forming a semiconductor device includes forming a mask layer on a stressed semiconductor layer of a stressed, semiconductor-on-insulator wafer. An isolation trench bounding the stressed semiconductor layer is formed. The isolation trench extends through the mask layer and into the SOI wafer past an oxide layer thereof. A dielectric body is formed in the isolation trench. A relaxation reduction liner is formed on the dielectric body and on an adjacent sidewall of the stressed semiconductor layer. The mask layer on the stressed semiconductor layer is removed.

23 Claims, 9 Drawing Sheets

SEMICONDUCTOR DEVICE WITH RELAXATION REDUCTION LINER AND ASSOCIATED METHODS

FIELD OF THE INVENTION

The present invention relates to the field of electronic devices, and more particularly, to semiconductor devices and related methods.

BACKGROUND OF THE INVENTION

Some semiconductor devices utilize semiconductor-on-insulator (SOI) technology, in which a thin layer of a semiconductor, such as silicon, is separated from a semiconductor substrate or wafer by a relatively thick electrically insulating layer. This thick electrically insulating layer is also referred to as a buried oxide (BOX) layer. The semiconductor layer typically has a thickness of a few nanometers, whereas the semiconductor substrate typically has a thickness of a few tens of nanometers.

SOI technology offer certain advantages compared to traditional bulk technology for Complementary Metal Oxide Semiconductor (CMOS) devices. CMOS devices include nMOSFET transistors and pMOSFET transistors both formed in the thin silicon layer which overlies the buried oxide (BOX) layer. SOI technology allows CMOS devices to operate at lower power consumption while providing the same performance level.

One particular type of SOI technology that is helping to allow for continued CMOS scaling is fully depleted SOI (FDSOI). As opposed to a partially depleted SOI (PDSOI) device, in an FDSOI device a relatively thin semiconductor channel layer is provided over the buried oxide (BOX) layer, such that the depletion region of the device covers the whole layer. FDSOI devices may provide advantages such as higher switching speeds and a reduction in threshold voltage roll off, as compared to PDSOI devices, for example.

To improve CMOS device performance, stress may be introduced into the channels of the field effect transistors (FETs). When applied in a longitudinal direction (i.e., in the direction of current flow), tensile stress is known to enhance electron mobility (i.e., n-channel MOSFET drive currents) while compressive stress is known to enhance hole mobility (i.e., p-channel MOSFET drive currents). Consequently, tensile stressed silicon-on-insulator (sSOI) is a main performance driver for nMOSFET transistors, and compressive stressed silicon-germanium-on-insulator (SGOI) is a main performance driver for pMOSFET transistors.

To prevent electrical current leakage between adjacent nMOSFET and pMOSFET transistors in a stressed SOI wafer, a shallow trench isolation (STI) is formed between the two transistors. An STI is generally formed early during the semiconductor device fabrication process before the transistors are formed. To form an STI, a mask layer is formed on the stressed semiconductor layer and an isolation trench is formed through the mask layer and into the SOI wafer between the two active regions corresponding to the adjacent nMOSFET and pMOSFET transistors. A dielectric body is formed in the isolation trench.

As the hard mask is removed, a mechanical relaxation of the stressed semiconductor layer occurs at an edge thereof that contacts the dielectric body in the isolation trench. As illustrated by the semiconductor device 10 in FIG. 1, the mechanical relaxation is elastic and may result in a divot or gap 12 being formed between a sidewall 23 of the stressed semiconductor layer 22 and an adjacent sidewall 17 of the STI 16. The stressed semiconductor layer 22 is part of a stressed SOI wafer 20 that includes a buried oxide layer (BOX) 24 and a semiconductor substrate or wafer 26. A mechanical relaxation of the stressed semiconductor layer 22 negatively effects carrier mobility and transistor threshold voltage variability.

SUMMARY OF THE INVENTION

A method for forming a semiconductor device comprising forming a mask layer on a stressed semiconductor layer of a stressed, semiconductor-on-insulator wafer, and forming an isolation trench bounding the stressed semiconductor layer. The isolation trench may extend through the mask layer and into the SOI wafer past an oxide layer thereof. The method may further comprise forming a dielectric body in the isolation trench, forming a relaxation reduction liner on the dielectric body and on an adjacent sidewall of the stressed semiconductor layer, and removing the mask layer on the stressed semiconductor layer.

The relaxation reduction liner on the dielectric body and on an adjacent sidewall of the stressed semiconductor layer advantageously reduces relaxation of the stressed semiconductor layer when a mask layer used to form the STI is removed after formation of the STI. The relaxation reduction liner advantageously maintains a mechanical continuity of the stressed semiconductor layer. The relaxation reduction liner may comprise a material having a high Young's modulus, such as aluminum oxide or hafnium oxide, for example. A value of the Young's modulus may be greater then 70 GPa.

The stressed semiconductor layer may comprise silicon to define an active region for an n-channel metal-oxide semiconductor field-effect transistor. Alternatively, the stressed semiconductor layer may comprise silicon and germanium to define an active region for a p-channel metal-oxide semiconductor field-effect transistor.

An upper surface of the relaxation reduction liner may be formed to be coplanar with an upper surface of the stressed semiconductor layer. Alternatively, an upper surface of the relaxation reduction liner on the adjacent sidewall of the stressed semiconductor layer may be formed to be above an upper surface of the stressed semiconductor layer.

An upper surface of the dielectric body may be formed to be coplanar with an upper surface of the oxide layer. The method may further comprise forming a gate stack over the stressed semiconductor layer, and forming raised source and drain regions defining a channel therebetween under the gate stack.

DETAILED DESCRIPTION OF THE PREFERRED EMBODIMENTS

The present embodiments will now be described more fully hereinafter with reference to the accompanying drawings, in which preferred embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout, and prime notation is used to indicate similar elements in alternative embodiments.

Figure 1:
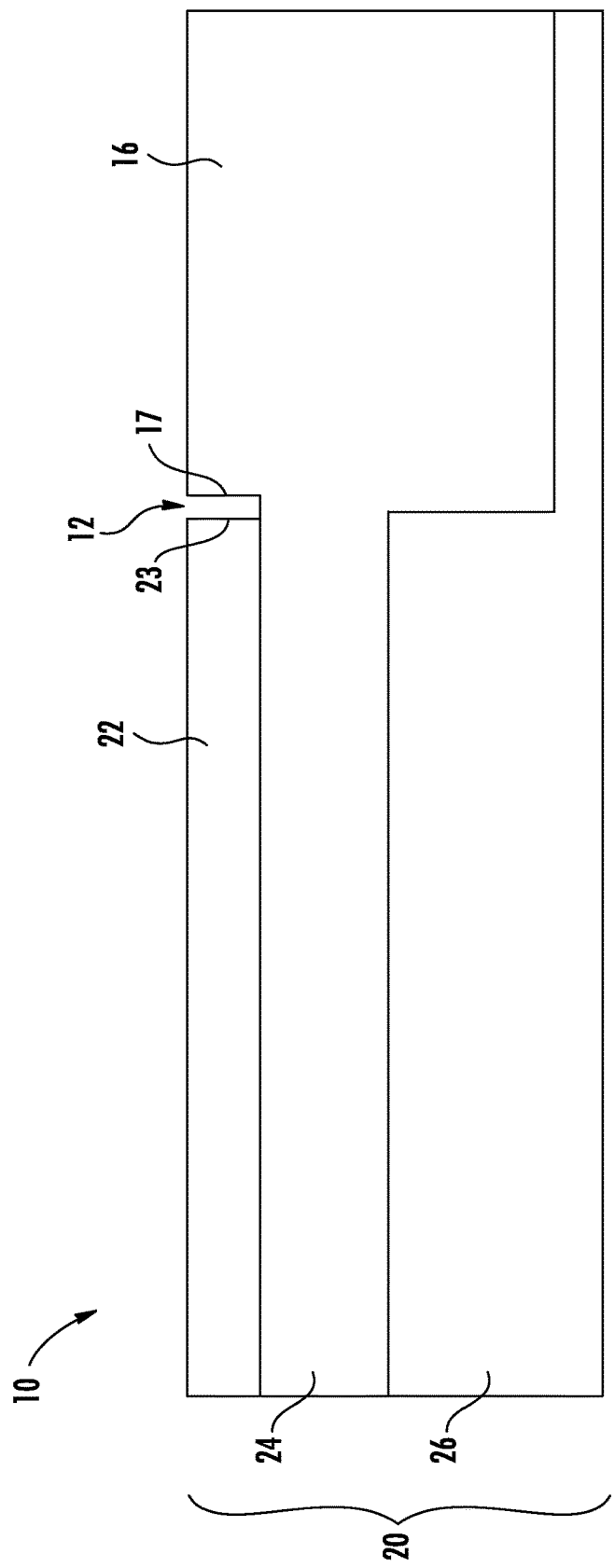
FIG. 1 is a cross-sectional diagram of a semiconductor device in accordance with the prior art.
Figure 2:
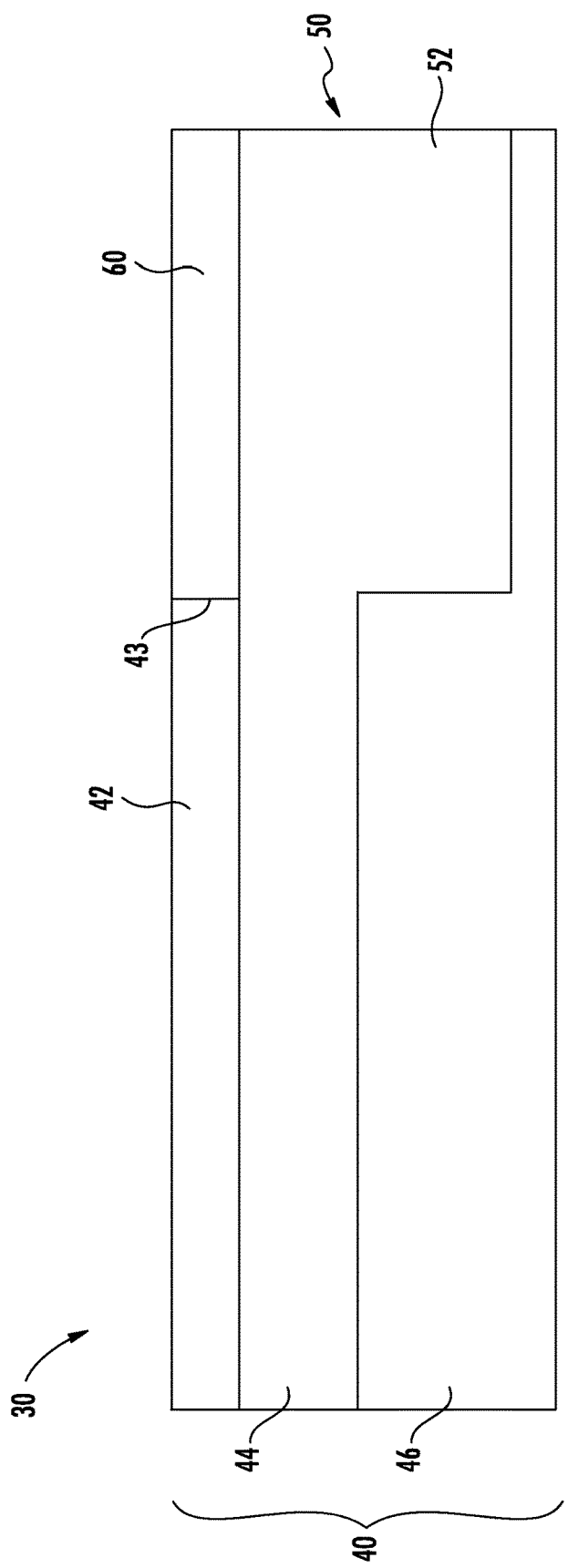
FIG. 2 is a cross-sectional diagram of a semiconductor device in accordance with the present embodiment.

Referring initially to FIG. 2, a semiconductor device 30 is first described, which is a CMOS semiconductor device. In the illustrated embodiment, the semiconductor device 30 includes a stressed SOI wafer 40 that includes a semiconductor substrate or wafer 46, a buried oxide (BOX) layer 44 on the semiconductor substrate, and a stressed semiconductor layer 42 on the buried oxide layer. The stressed semiconductor layer 42 defines a first active region.

The stressed SOT wafer 40 may be a fully depleted SOI (FDSOI) wafer, as readily appreciated by those skilled in the art. In addition, the stressed SOI wafer 40 may be an ultra-thin body and box (UTBB) wafer, as also readily appreciated by those skilled in the art. For example, a thickness of the semiconductor substrate 46 may be within a range of about 10 to 25 nm, and a thickness of the stressed semiconductor layer 42 may be within a range of about 5 to 10 nm.

A shallow trench isolation (STI) 50 bounds the stressed semiconductor layer 42, with the STI extending into the 301 wafer 40 past the buried oxide layer 44 thereof. A relaxation reduction liner 60 is on the STI 50 and on an adjacent sidewall 43 of the stressed semiconductor layer 42.

As will be explained in greater detail below, a mask layer used to form the STI 50 has a high Young's modulus. Consequently, when the mask layer is in place, the mechanical continuity of the stressed semiconductor layer 42 is maintained. When the mask layer is removed, the relaxation reduction liner 60 advantageously reduces relaxation of the stressed semiconductor layer 42. This may be accomplished by maintaining the mechanical continuity of the stressed semiconductor layer 42.

The relaxation reduction liner 60 may comprise a material having a high Young's modulus. A value of the Young's modulus needs to be greater than the dielectric body 52 in the STI 50. After annealing, the dielectric body 52 (e.g., silicon oxide) typically has a Young's modulus within a range of 60 to 70 GPa. Consequently, a high Young's modulus needs to be greater than 70 GPa. Example materials with a high Young's modulus are aluminum oxide and hafnium oxide. Aluminum oxide has a Young's modulus within a range of 200 to 400 GPa, and hafnium oxide has a Young's modulus within a range of 70 to 150 GPa. The mechanical properties of the materials being used for the relaxation reduction liner 60 vary, which in turn, causes the measured values of the Young's modulus to likewise vary, as readily appreciated by those skilled in the art.

Another factor in selecting a material for the relaxation reduction liner 60 is that it needs to have a high etch selectively. The high etch selectively is with respect to oxide and nitride, for example. Also, the relaxation reduction liner 60 needs to exhibit good dielectric properties. Materials other than aluminum oxide and hafnium oxide may be used, as long as they have a high Young's modulus, have a high etch selectively with respect to oxide and nitride, and have good dielectric properties.

Figure 3:
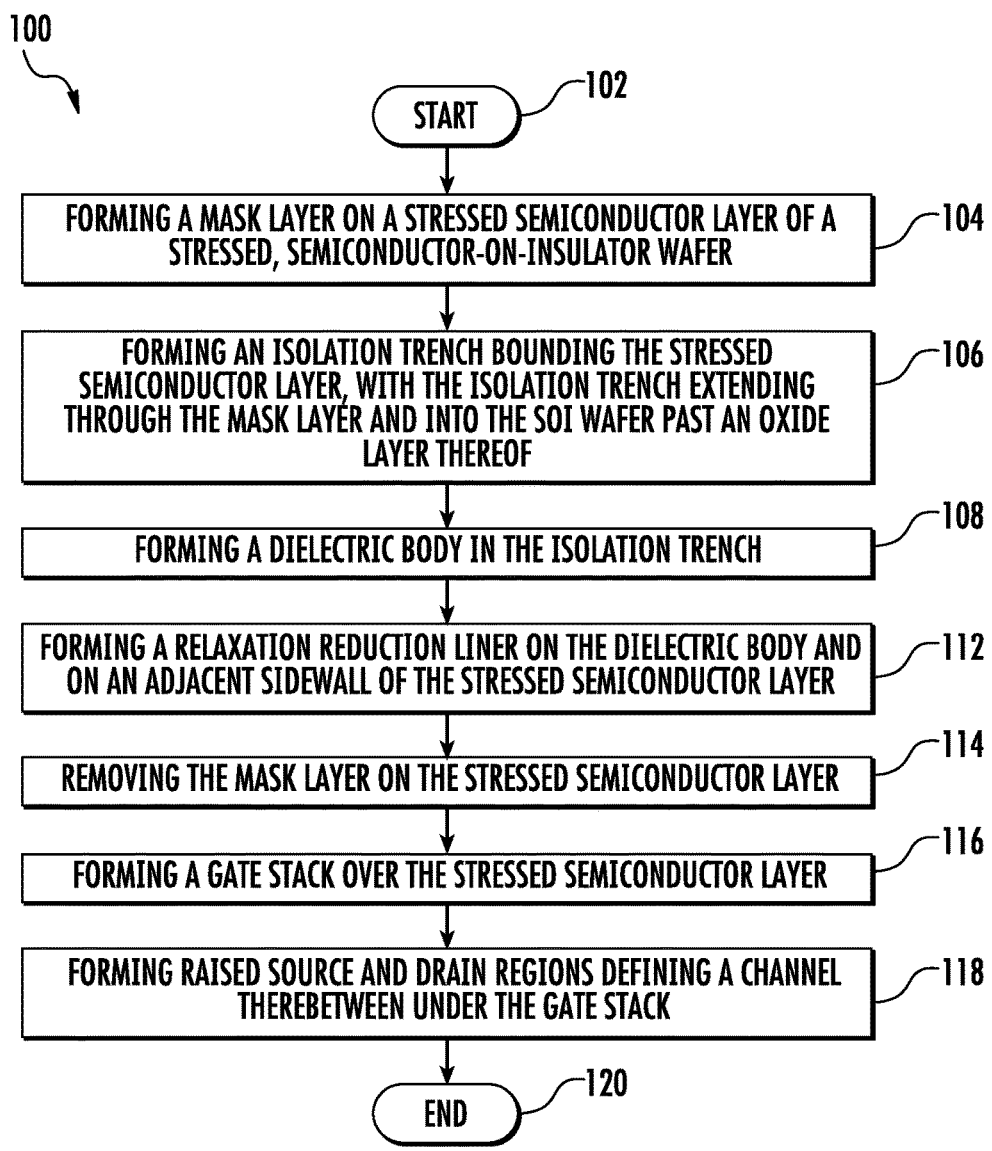
FIG. 3 is a flowchart illustrating a method for forming the semiconductor device of FIG. 2.

A method for forming the semiconductor device 30 is now described with reference to the flowchart 100 in FIG. 3 and to the corresponding process flows illustrated in FIGS. 4-9.

Figure 4:
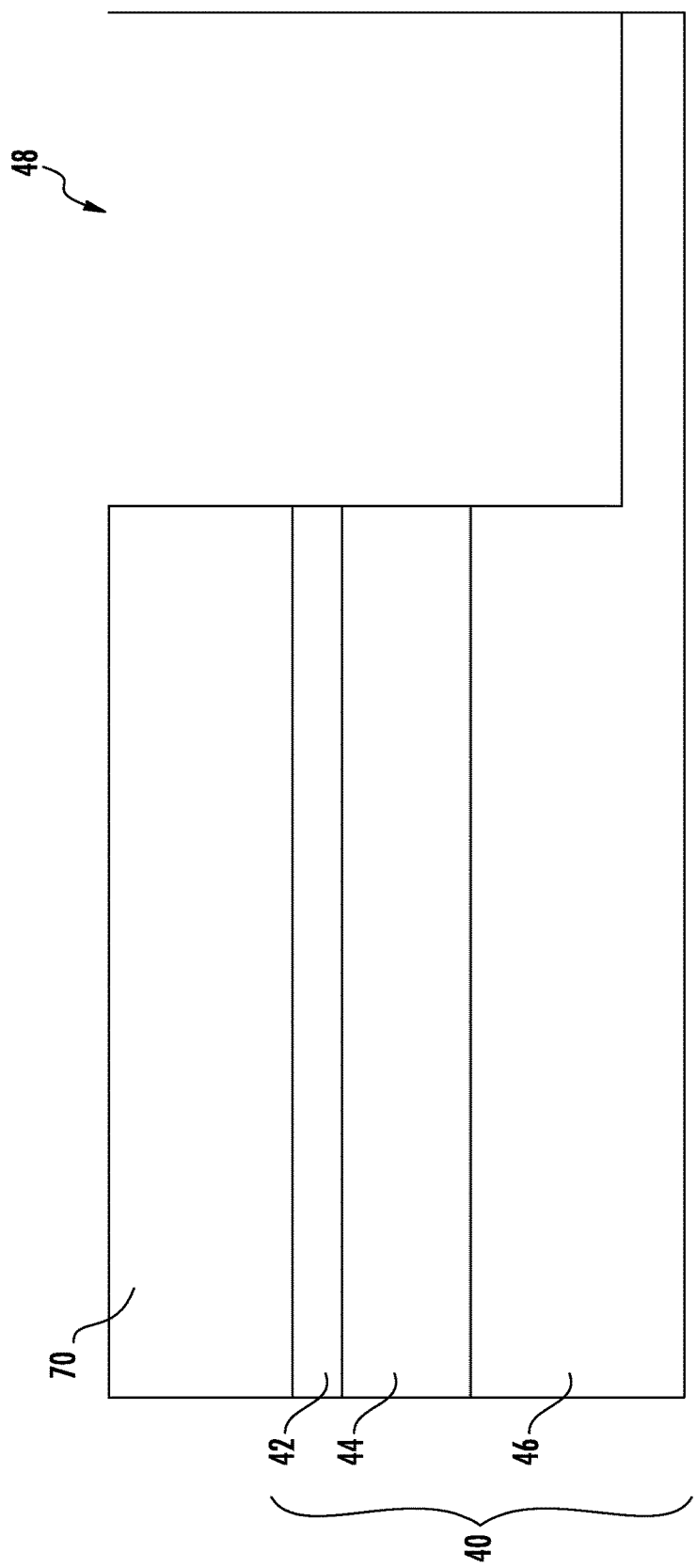
FIGS. 4-8 are a series of cross-sectional diagrams illustrating the method of FIG. 2.

From the start (Block 102), a mask layer 70 is formed at Block 104 on the stressed semiconductor layer 42, as illustrated in FIG. 4.

Figure 5:
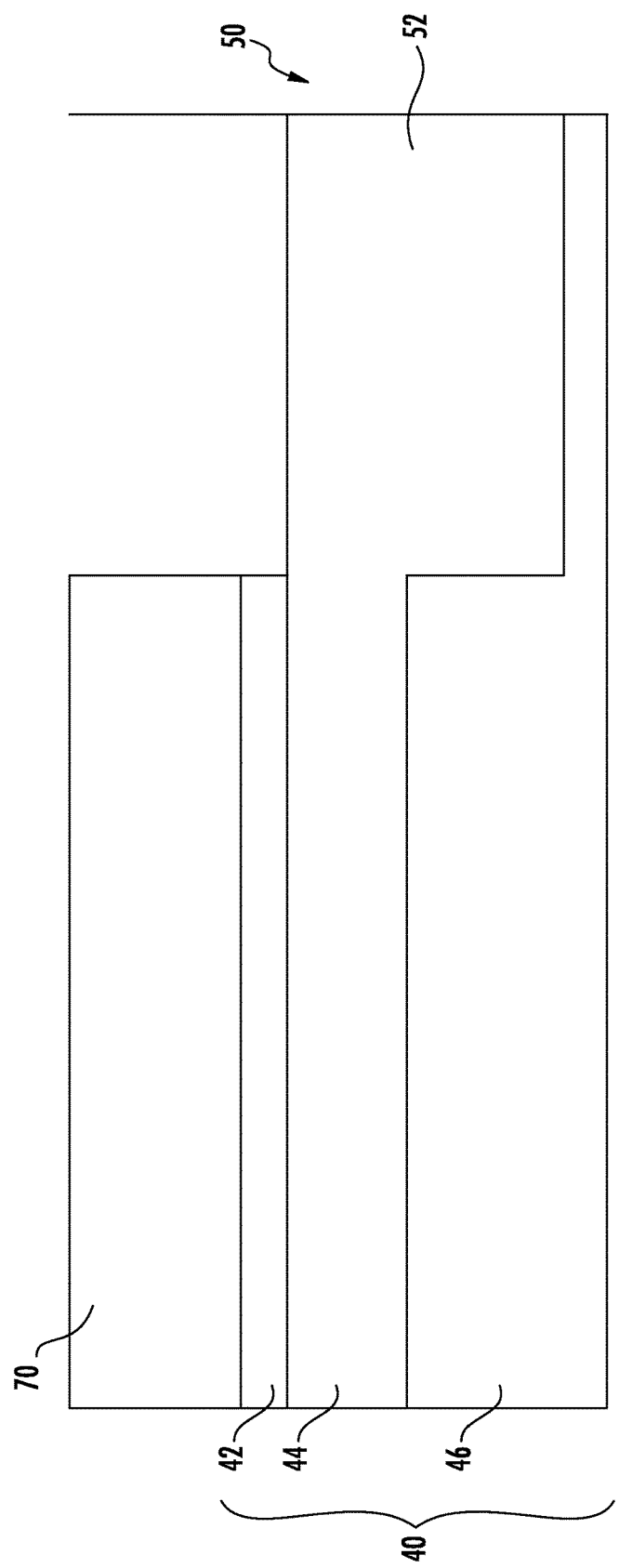

An isolation trench 48 bounding the stressed semiconductor layer 42 is formed at Block 106, as also illustrated in FIG. 4. The isolation trench 48 extends through the mask layer 70 and into the SOT wafer 40 past the oxide layer 44. A dielectric body 52 is formed in the isolation trench 48 at Block 108 to define the STI 50, as illustrated in FIG. 5. The dielectric body 52 is an oxide, which is a soft material having a low Young's modulus (i.e., less than 70 GPa).

Typically, the oxide fills the isolation trench 48 past the mask layer 70. In this example embodiment, the oxide is selectively removed so that an upper surface of the remaining dielectric body 52 is coplanar with an upper surface of the oxide layer 44.

Figure 6:
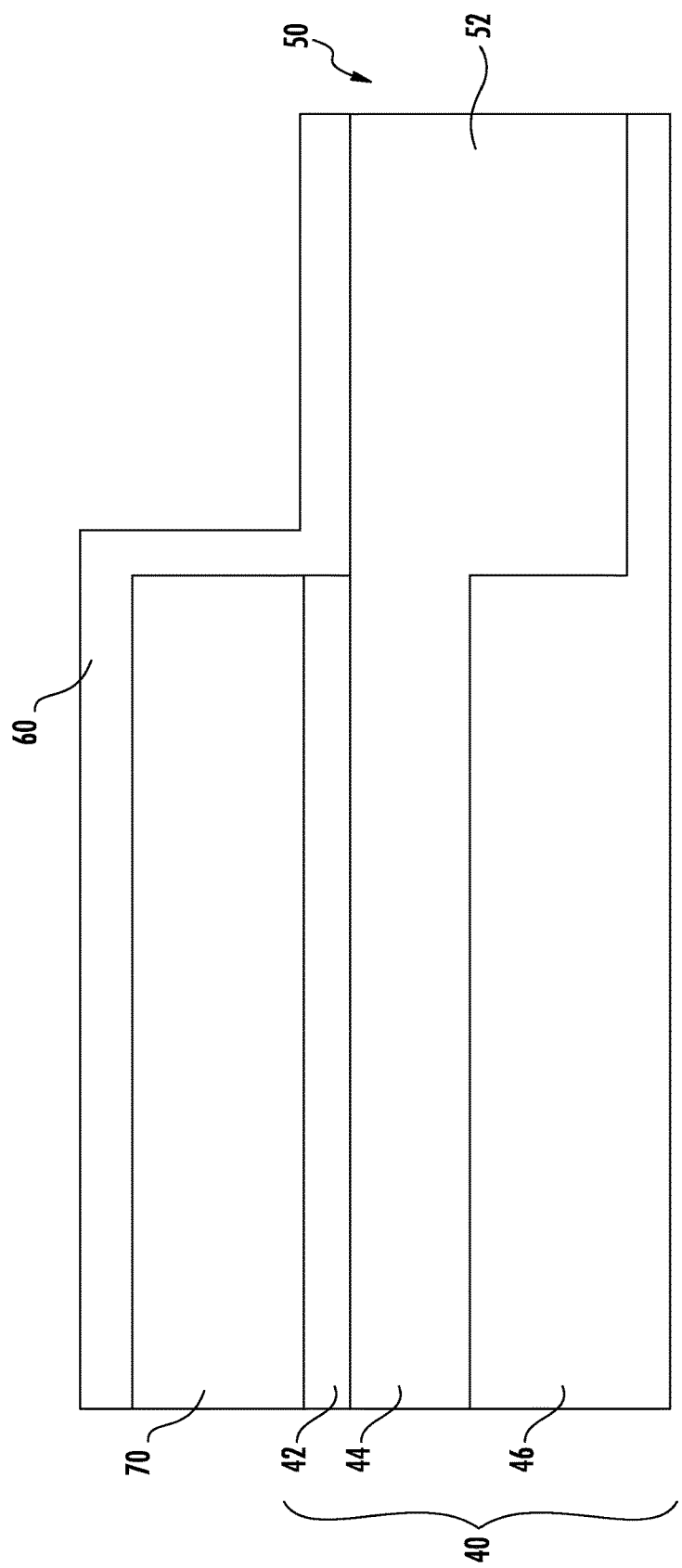

The relaxation reduction liner 60 is formed at Block 112 on the dielectric body 52 and on an adjacent sidewall 43 of the stressed semiconductor layer 42, as illustrated in FIG. 6. In this example embodiment, the relaxation reduction liner 60 is also formed on the mask layer 70. As discussed above, the relaxation reduction liner 60 may comprise a material having a high Young's modulus, such as aluminum oxide or hafnium oxide, for example. In addition, aluminum oxide and hafnium oxide both have good dielectric properties and high etch selectively versus oxide and nitride. In this example embodiment, the mask layer 70 and the portion of the relaxation reduction liner 60 on the mask layer are removed at Block 114 so that an upper surface of the remaining relaxation reduction liner 60 is coplanar with an upper surface of the stressed semiconductor layer 42, as illustrated in FIG. 2.

Figure 7:
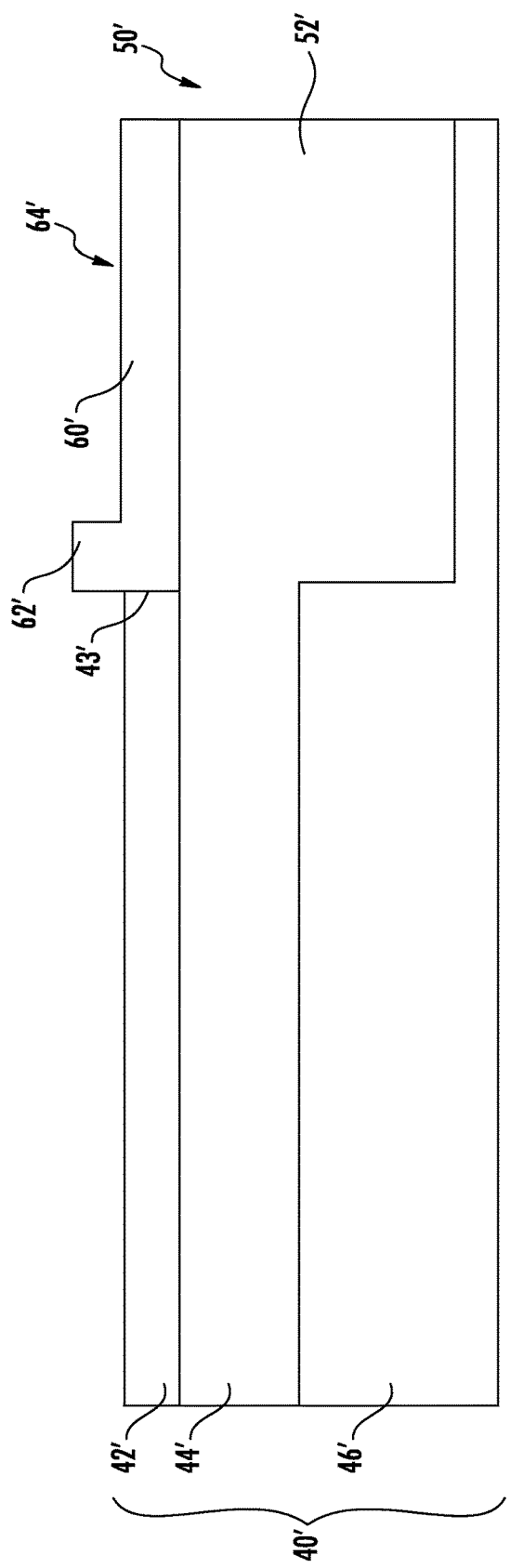
Figure 8:
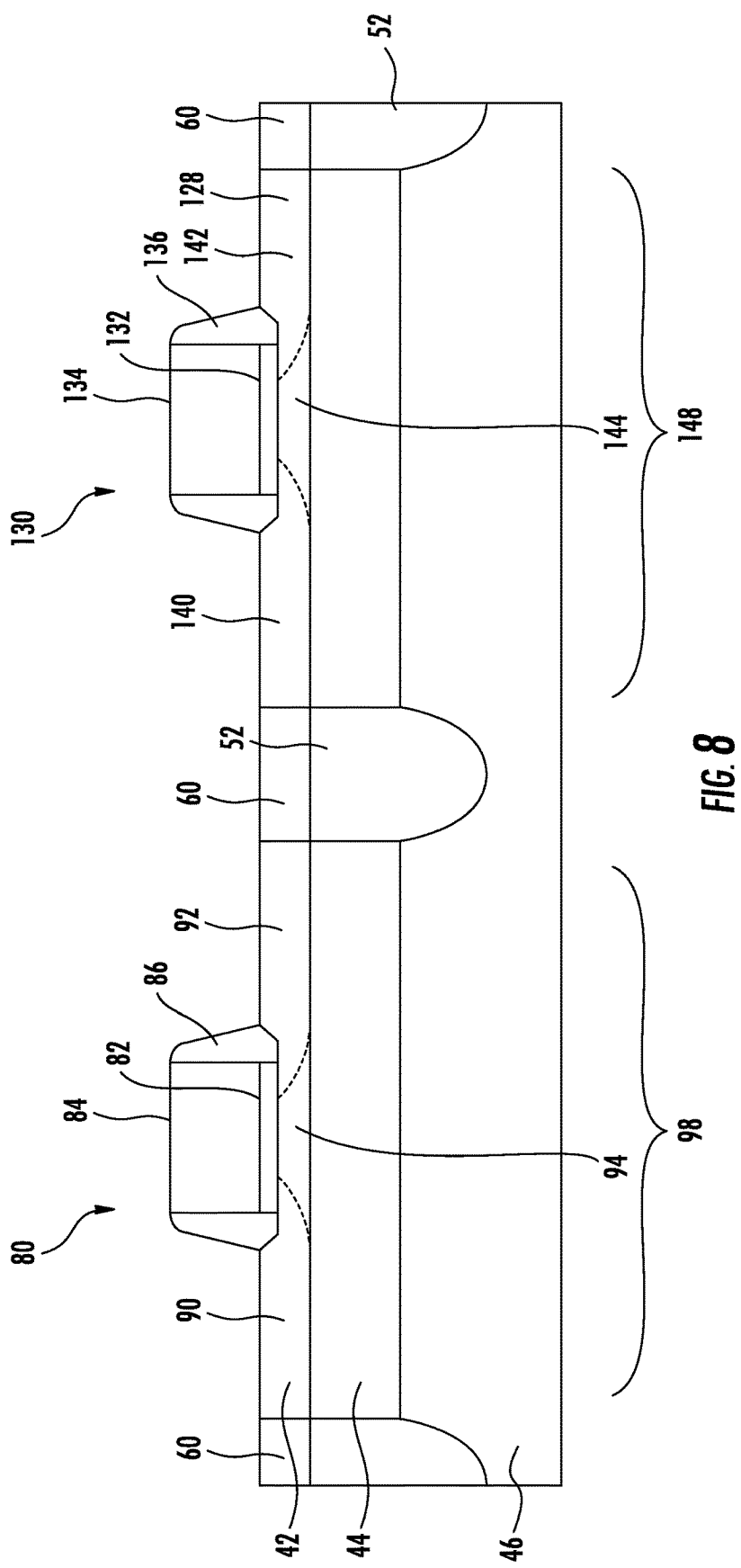

In an alternative embodiment, the mask layer 70 and the portion of the relaxation reduction liner 60 on the mask layer are removed at Block 114 so that an upper surface of the relaxation reduction liner on the adjacent sidewall 43' of the stressed semiconductor layer 42' is above an upper surface of the stressed semiconductor layer, as illustrated in FIG. 7. The relaxation reduction liner 60' thus includes an edge portion 62' contacting the adjacent sidewall 43' of the stressed semiconductor layer 42' and a non-edge portion 64'. The upper surface of the edge portion 62' is above an upper surface of the stressed semiconductor layer 42' and an upper surface of the non-edge portion 64' is coplanar with the upper surface of the stressed semiconductor layer 42'. A thickness of the non-edge portion 64' of the relaxation reduction liner 60' may be within a range of about 5 to 10 nm, i.e., same as a thickness of the stressed semiconductor layer 42. A thickness of the edge portion 62' of the relaxation reduction liner 60' may be within a range of about 10 to 20 nm.

As the mask layer 70 is removed, the relaxation reduction liner 60 on the dielectric body 52 and on an adjacent sidewall 43 of the stressed semiconductor layer 42 advantageously reduces relaxation of the stressed semiconductor layer. The relaxation reduction liner 60 advantageously maintains the mechanical continuity of the stressed semiconductor layer, which is not the case if the dielectric body 52 were instead on the adjacent sidewall 43 of the stressed semiconductor layer 42.

The method further comprises forming a first gate stack 80 at Block 116 over the stressed semiconductor layer 42, which defines a first active region. In the illustrated embodiment of the semiconductor device shown in FIG. 8, the gate stack 80 includes a gate dielectric layer 82, a gate electrode layer 84, and sidewall spacers 86. As readily appreciated by those skilled in the art, the semiconductor device may be a CMOS semiconductor device. In this case, the method may further comprise forming a second gate stack 130 over a stressed semiconductor layer 128, which defines a second active region. The gate stack 130 includes a gate dielectric layer 132, a gate electrode layer 134, and sidewall spacers 136. The STI 60 and the dielectric material 52 in the STI 50 separate the first and second active regions 42, 128.

Raised source and drain regions 90, 92 are formed at Block 118 to define a first channel 94 therebetween in the first active region under the first gate stack 80. In one embodiment, the channel region 94 is for an n-channel metal-oxide semiconductor field-effect transistor (nMOSFET) 98. Similarly, raised source and drain regions 140, 142 are formed to define a second channel 144 therebetween in the second active region under the second gate stack 130. In one embodiment, the channel region 144 is for an p-channel metal-oxide semiconductor field-effect transistor (pMOSFET) 148. The method ends at Block 120.

In view of the above, a variety of different transistor structures may be implemented, including but not necessarily limited to: planar CMOS, high-k metal gate CMOS, PD-SOI, FD-SOI, UTBB, vertical double gate, buried gate, FinFET, tri-gate, multi-gate, 2D, 3D, raised source/drain, strained source/drain, strained channel, and combinations/hybrids thereof, for example.

Figure 9:
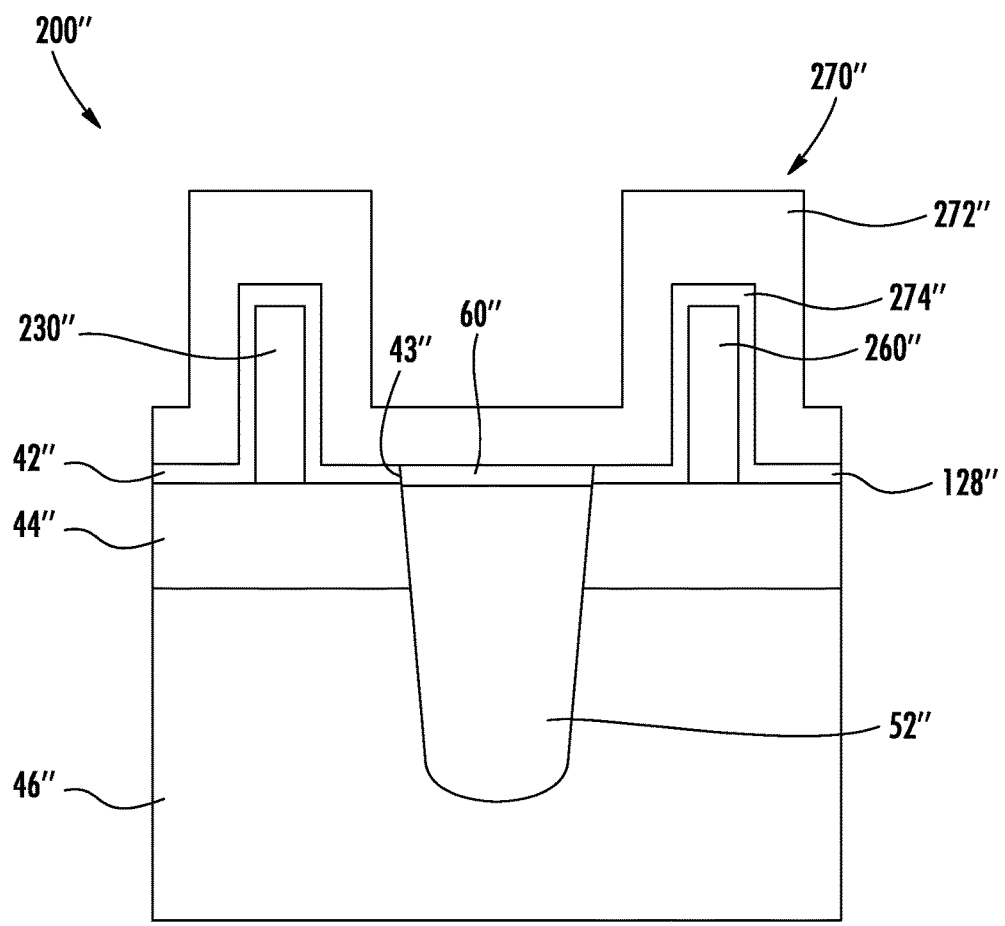
FIG. 9 is a cross-sectional view of a FinFET device in accordance with the present embodiment.

A cross-sectional view of a FinFET device 200" is illustrated in FIG. 9. The FinFET device 200" includes a stressed SOI wafer that includes a semiconductor substrate or wafer 46", a buried oxide (BOX) layer 44" on the semiconductor substrate, and a stressed semiconductor layer 42" on the buried oxide layer. The stressed semiconductor layer 42" defines a first active region. Another stressed semiconductor layer 128" is on the buried oxide layer 44" adjacent the active region 42" and defines a second active region, as discussed above.

A shallow trench isolation (STI) includes a dielectric body 52" that bounds the stressed semiconductor layer 42", as also discussed above. The dielectric body 52" in the STI extends into the SOI wafer past the buried oxide layer 44" thereof. A relaxation reduction liner 60" is on the dielectric body 52" and on an adjacent sidewall 43" of the stressed semiconductor layer 42".

The stressed semiconductor layer 42" defining the first active region is for an nMOSFET, and the second stressed semiconductor layer 128" defining the second active region is for a pMOSFET. A fin 230" defines the channel for the nMOSFET, and a fin 260" defines the channel for the pMOSFET. A gate 270" overlies the fins 230", 260" and includes a polysilicon layer 272" on a dielectric layer 274".

The FinFET device 200" includes raised source/drain regions, which may be epitaxially grown. Epitaxially grown SiGe may be used in reducing resistance and stress of the source/drain regions. This aspect of the source/drain regions is also applicable to FD-SOI.

Many modifications and other embodiments will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for forming a semiconductor device comprising:

forming a mask layer on a stressed semiconductor layer of a stressed semiconductor-on-insulator (SOI) wafer comprising a substrate, an oxide layer on the substrate, and the stressed semiconductor layer on the oxide layer, the oxide layer having a substantially uniform thickness;

forming an isolation trench through the stressed semiconductor layer, through the mask layer, and into the substrate, the isolation trench exposing first and second side surfaces of the stressed semiconductor layer within the isolation trench, the first and second side surfaces of the stressed semiconductor layer facing each other;

forming a dielectric body in the isolation trench, the dielectric body directly contacting the oxide layer and the substrate, the dielectric body extending between the first and second side surfaces of the stressed semiconductor layer;

forming a relaxation reduction liner on the dielectric body extending between and abutting the first and second side surfaces of the stressed semiconductor layer within the isolation trench, a portion of the relaxation reduction liner being on the mask layer;

removing the mask layer and the portion of the relaxation reduction liner on the mask layer from the stressed semiconductor layer, a first upper surface of the relaxation reduction liner being substantially coplanar with an upper surface of the stressed semiconductor layer after removing the mask layer;

forming at least one of a source region and a drain region in the stressed semiconductor layer, the stressed semiconductor layer and the at least one of a source region and a drain region having a same thickness, the at least one of a source region and a drain region overlying and in direct contact with the oxide layer and abutting the relaxation reduction liner; and forming a gate stack over the stressed semiconductor layer after removing the mask layer and the portion of the relaxation reduction liner.

2. The method according to claim 1 wherein the relaxation reduction liner comprises aluminum oxide.

3. The method according to claim 1 wherein the relaxation reduction liner comprises hafnium oxide.

4. The method according to claim 1 wherein the relaxation reduction liner has a Young's modulus greater than 70 GPa.

5. The method according to claim 1 wherein the stressed semiconductor layer comprises silicon.

6. The method according to claim 1 wherein the stressed semiconductor layer comprises silicon and germanium.

7. The method according to claim 1 wherein a second upper surface of the relaxation reduction liner is abutting the first side surface of the stressed semiconductor layer and is formed to be above the upper surface of the stressed semiconductor layer.

8. The method according to claim 1 wherein forming the at least one of a source region and a drain region includes forming raised source and drain regions defining a channel therebetween under the gate stack.

9. The method according to claim 8 wherein the channel is for a metal-oxide semiconductor field-effect transistor (MOSFET) having a FinFET structure.

10. A method for forming a semiconductor device comprising:

forming a mask layer on a stressed silicon layer of a stressed silicon-on-insulator (SOI) wafer comprising a substrate, an oxide layer on the substrate, and the stressed silicon layer on the oxide layer;

forming an isolation trench through the stressed silicon layer, through the mask layer, and into the substrate, the isolation trench exposing first and second side surfaces of the stressed silicon layer within the isolation trench;

forming a dielectric body in the isolation trench, the dielectric body directly contacting the oxide layer and the substrate;

forming a liner including at least one of aluminum oxide and hafnium oxide on the dielectric body extending between and abutting the first and second side surfaces of the stressed silicon layer within the isolation trench, a portion of the liner being on the mask layer;

removing the mask layer and the portion of the liner on the mask layer from the stressed silicon layer, a first upper surface of the liner being substantially coplanar with an upper surface of the stressed silicon layer after removing the mask layer;

forming at least one of a source region and a drain region in the stressed silicon layer, the stressed silicon layer and the at least one of a source region and a drain region having a same thickness, the at least one of a source region and a drain region overlying and in direct contact with the oxide layer and in direct contact with the liner; and forming a gate stack over the stressed silicon layer after removing the mask layer and the portion of the liner.

11. The method according to claim 10 wherein the stressed silicon layer comprises silicon and germanium.

12. The method according to claim 10 wherein a second upper surface of the liner on the adjacent sidewall of the stressed silicon layer is formed to be above the upper surface of the stressed silicon layer.

13. The method according to claim 10 wherein forming the at least one of a source region and a drain region includes forming raised source and drain regions defining a channel therebetween under the gate stack.

14. The method according to claim 13 wherein the channel is for a metal-oxide semiconductor field-effect transistor (MOSFET) having a FinFET structure.

15. A semiconductor device comprising:

a stressed semiconductor-on-insulator (SOI) substrate comprising a substrate, an oxide layer on said substrate, and a stressed semiconductor layer on said oxide layer, the oxide layer having a substantially uniform thickness;

a shallow trench isolation (STI) adjacent to said stressed semiconductor layer in said SOI substrate, with said STI extending into said SOI substrate past said oxide layer, with said STI directly contacting said oxide layer and said substrate;

a relaxation reduction liner on said STI and extending between and abutting first and second side surfaces of said stressed semiconductor layer, a first upper surface of the relaxation reduction liner being substantially coplanar with an upper surface of the stressed semiconductor layer;

source and drain regions formed in the stressed semiconductor layer, each of the source and drain regions overlying and in direct contact with the oxide layer and in abutting contact with side surfaces of the relaxation reduction liner; and a gate stack on the stressed semiconductor layer, the gate stack overlying portions of the source and drain regions.

16. The semiconductor device according to claim 15 wherein said relaxation reduction liner comprises aluminum oxide.

17. The semiconductor device according to claim 15 wherein said relaxation reduction liner comprises hafnium oxide.

18. The semiconductor device according to claim 15 wherein said relaxation reduction liner has a Young's modulus greater than 70 GPa.

19. The semiconductor device according to claim 15 wherein said stressed semiconductor layer comprises silicon.

20. The semiconductor device according to claim 15 wherein said stressed semiconductor layer comprises silicon and germanium.

21. The semiconductor device according to claim 15 wherein a second upper surface of said relaxation reduction liner abutting the first side surface of said stressed semiconductor layer is above the upper surface of said stressed semiconductor layer.

22. The semiconductor device according to claim 15 wherein the source and drain regions include raised source and drain regions defining a channel therebetween under said gate stack.

23. The semiconductor device according to claim 22 wherein the channel is for a metal-oxide semiconductor field-effect transistor (MOSFET) having a FinFET structure.

* * * * *